US012674848B2

(12) United States Patent
Zhu et al.

(10) Patent No.: US 12,674,848 B2
(45) Date of Patent: Jul. 7, 2026

(54) METHOD AND DEVICE FOR SHORT CIRCUIT DETECTION IN WIRING HARNESSES

(71) Applicant: Robert Bosch GmbH, Stuttgart (DE)

(72) Inventors: Qi Zhu, Reutlingen (DE); Andreas Domdey, Reutlingen (DE); Vasanthapriyan Senguttuvan, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 175 days.

(21) Appl. No.: 18/392,035

(22) Filed: Dec. 21, 2023

(65) Prior Publication Data

US 2024/0219480 A1     Jul. 4, 2024

(30) Foreign Application Priority Data

Jan. 3, 2023    (DE) ..................... 10 2023 200 034.2

(51) Int. Cl.
*G01R 31/52*        (2020.01)
*G01R 31/00*        (2006.01)
(52) U.S. Cl.
CPC .......... *G01R 31/52* (2020.01); *G01R 31/007* (2013.01)
(58) Field of Classification Search
CPC .... G01R 31/006–007; G01R 31/58–60; G01R 31/50; G01R 31/52; G01R 31/66–69
See application file for complete search history.

(56) References Cited

U.S. PATENT DOCUMENTS

| 5,231,357 | A | * | 7/1993 | Moody | .................. | G01R 31/52 |
| | | | | | | 324/538 |
| 9,297,848 | B2 | * | 3/2016 | Julson | .................... | G01R 31/11 |
| 2006/0043976 | A1 | * | 3/2006 | Gervais | .................. | G01R 31/58 |
| | | | | | | 324/508 |

FOREIGN PATENT DOCUMENTS

| DE | 102017201488 A1 | 8/2018 |
| DE | 102018215887 A1 | 3/2020 |
| DE | 102021119956 A1 | 2/2023 |

* cited by examiner

*Primary Examiner* — Lee E Rodak
*Assistant Examiner* — Demetrius R Pretlow
(74) *Attorney, Agent, or Firm* — NORTON ROSE FULBRIGHT US LLP

(57)        ABSTRACT

A method for detecting a short circuit in a wiring harness that contacts an electric device. The method includes: carrying out a first and second test measurements, in which a first and second predefined electric current is applied to an electric device connected to a line to be monitored of the wiring harness and resulting first and second electric voltages are detected, the second electric current being greater than the first electric current; ascertaining a measurement current based on a predefined target electric voltage by interpolation from the first and second electric currents and the first and second electric voltages; and carrying out a measurement in which the measurement current is applied to the electric device connected to the line and a resulting electric measurement voltage is detected; wherein a short circuit is detected based on a comparison of the measurement voltage and the target voltage.

9 Claims, 1 Drawing Sheet

METHOD AND DEVICE FOR SHORT CIRCUIT DETECTION IN WIRING HARNESSES

FIELD

The present invention relates to a method for detecting a short circuit in a wiring harness. The present invention also relates to a control device for detecting such a short circuit. Furthermore, the present invention relates to a vehicle having such a control device, wherein in particular a lambda sensor is connected to the wiring harness.

BACKGROUND INFORMATION

Vehicles having an internal combustion engine usually have a lambda sensor in order to enable catalytic exhaust gas purification by means of lambda control. It is a conventional feature of control devices in vehicles that they can provide a rough indication of whether there is a short circuit in the lambda sensor wiring.

SUMMARY

A method according to the present invention enables a pinpoint diagnosis, i.e., it is possible to identify in which cable of a wiring system there is a short circuit. This is a great advantage, particularly in lambda sensor wiring harnesses, and enables better monitoring of the lambda sensor and therefore more reliable exhaust gas purification. The method can be carried out not only for wiring harnesses with lambda sensors, but is generally suitable for detecting short circuits.

The method is used to detect a short circuit in a wiring harness, wherein it is provided that the wiring harness contacts at least one electric device. According to an example embodiment of the present invention, the method comprises the following steps:

First, a first test measurement and a second test measurement are carried out. During the first test measurement, a first predefined electric current is applied to an electric device connected to a line to be monitored of the wiring harness. In addition, a resulting first electric voltage is detected. In the second test measurement, a second predefined electric current is applied to the electric device connected to the line to be monitored of the wiring harness, and a resulting second electric voltage is detected. Here it is provided that the second electric current is greater than the first electric current.

In particular, an electric resistance is realized by the connected electric device. If an electric current is applied, an electric voltage can be measured according to Ohm's law. This electric voltage is used as a measurement variable.

After the first test measurement and the second test measurement have been carried out, a measurement current is ascertained on the basis of a predefined target electric voltage by interpolation from the first electric current and the second electric current and the first electric voltage and the second electric voltage. A measurement is then carried out in which the measurement current is applied to the electric device connected to the line to be monitored of the wiring harness, and a resulting electric measurement voltage is detected. A detection of a short circuit takes place on the basis of a comparison of the measurement voltage and the target voltage.

In this way, on the one hand a reliable detection of a short circuit is achieved. When detecting the electric measurement voltage, it is expected that it will correspond to the predefined target voltage so that there is no short circuit. A deviation, in particular a deviation greater than a minimum value, permits the inference that there is a short circuit.

Furthermore, the test measurements make it possible to carry out the actual measurement with a current and voltage that are within operating limits of the electric device. An electric circuit for generating the electric current to be applied has different tolerances with regard to behavior. This means that there is a fundamental risk of applying a current that is impermissibly high for the electric device. If the predefined target voltage is always expected for short circuit detection, on the one hand the associated measurement current is not known due to an unknown behavior of the electric device, for example due to manufacturing tolerances.

The steps described above, in particular the test measurements, allow a behavior to be ascertained when the current is applied. This allows a sufficiently high test voltage to be set, which enables a reliable distinction to be made between the short circuit and no short circuit states, while ensuring that the associated current to be applied does not exceed an operating limit of the electric device. Reliable short circuit detection of individual lines is therefore enabled, wherein the electric device can be operated reliably and safely.

Preferred developments of the present invention are disclosed herein.

According to an example embodiment of the present invention, the step of carrying out the measurement is preferably carried out repeatedly. This makes it possible to check whether there is a short circuit at regular time intervals. Alternatively or additionally, the steps of carrying out the first test measurement and second test measurement and of ascertaining the measurement current are carried out once or repeatedly with a lower repetition rate than the carrying out of the measurement. In principle, it is sufficient to ascertain the measurement current once, as a result of which the first test measurement and the second test measurement also only have to be carried out once. As described above, a short circuit test can then regularly be carried out with the measurement current. By repeatedly carrying out the first test measurement and the second test measurement and ascertaining the measurement current, fluctuations in the behavior of the electric device and/or the electric circuit generating the current can be compensated for. Here the actual measurement, i.e., the short circuit test, is carried out more frequently than the ascertaining of the measurement current.

Advantageously, according to an example embodiment of the present invention, the measurement current is ascertained on the basis of linear interpolation. In particular when using lambda sensors as an electric device, a linear behavior is to be expected, or at least an optimal approximation of the actual behavior. A linear interpolation can be carried out easily and quickly. Even if the behavior of the electric device is not supposed to be linear, the actual behavior can be approximated by repeatedly carrying out the test measurements as described above with a modified first current and second current.

The present invention further relates to a computer program. The computer program is set up to carry out a method according to the present invention as described above. The computer program is capable of running in particular on a control device of a vehicle.

Furthermore, the present invention relates to a machine-readable storage medium on which the computer program according the present invention as described above is stored.

The storage medium is in particular a data carrier and/or a data memory and is preferably used for electronic storage and/or for magnetic storage and/or for optical storage and/or for magneto-optical storage of the program code of the computer program.

The present invention also relates to a control device of a vehicle. According to an example embodiment of the present invention, the control device has a switching device and a logic unit. The switching device can be connected to a wiring harness. In this way, the switching device can be connected to an electric device via the wiring harness. Via the wiring harness, the electric device can in particular transmit data and/or signals to the switching device and/or can be controlled by the switching device and/or supplied with electric power. The logic unit is designed to control the switching device.

According to an example embodiment of the present invention, the switching device is designed to receive a specification for an output current, in particular from the logic unit. In addition, the switching device is designed to apply the prespecified output current to the electric device connected to a line to be monitored of the wiring harness. In this way, a test measurement or a measurement for short circuit testing can be carried out.

The logic unit is designed to carry out a first test measurement, a second test measurement, and an ascertainment of a measurement current. For the first test measurement, the logic unit is designed to specify a first predefined current as output current to the switching device, so that the first predefined electric current is applied to the electric device by means of the switching device. In addition, a resulting first electric voltage is detected during the first measurement. The first resulting voltage is detected by the switching device, which outputs the detected value in particular to the logic unit, or by the logic unit itself. The second test measurement takes place analogously, so that, by means of the switching device, a second predefined electric current is applied to the electric device and a resulting second electric voltage is detected. Again, the first resulting voltage is detected by the switching device or by the logic unit itself. It is provided that the second electric current is greater than the first electric current.

According to an example embodiment of the present invention, the logic unit is designed to ascertain a measurement current on the basis of a predefined target electric voltage by interpolation from the first electric current and the second electric current and the first electric voltage and the second electric voltage. In particular, the predefined target voltage can be transferred to the logic unit by an input device and/or retrieved from a memory. Furthermore, the logic unit is designed to carry out a measurement. In contrast to the test measurements, the measurement is used for the actual detection of short circuits. During the measurement, the measurement current which was previously ascertained by the logic unit based on the test measurements can be applied to the electric device by means of the switching device, wherein a resulting electric measurement voltage is detected. The measurement voltage is detected analogously to the detection of the first electric voltage and the second electric voltage, via the logic unit or the switching device.

According to an example embodiment of the present invention, the logic unit is also set up to carry out a detection of a short circuit on the basis of a comparison of the measurement voltage and the target voltage. Thus, during the measurement, the logic unit expects that the target voltage is detected as the measurement voltage. If this is not the case, a short circuit can be inferred from the deviation of the measurement voltage from the target voltage.

Particularly advantageously, according to an example embodiment of the present invention, the switching device is an application-specific integrated circuit. This is usually referred to as an ASIC for short. Such an ASIC can be produced in a simple and cost-effective manner and allows a reliable and low-energy performance of the steps described above for which the switching device is designed.

The logic unit is preferably set up to carry out the measurement repeatedly. Alternatively or additionally, the logic unit is designed to carry out the first test measurement and second test measurement and the ascertaining of the measurement current once or repeatedly with a lower repetition rate than the carrying out of the measurement. As described above, in principle it is sufficient to ascertain the measurement current once, as a result of which the first test measurement and the second test measurement also only have to be carried out once. As described above, a short circuit test can then regularly be carried out with the measurement current.

The logic unit is preferably designed to carry out the ascertaining of the measurement current on the basis of linear interpolation. In this way, the logic unit can be produced in a simple and cost-effective manner. In addition, optimal ascertaining of the measurement current can thereby be achieved.

The present invention also relates to a vehicle. According to an example embodiment of the present invention, the vehicle has a control device as described above. In addition, the vehicle has a wiring harness and an electric device. It is provided that a switching device of the control device is connected to the wiring harness. The electric device is likewise connected to the wiring harness, wherein an electric connection between the control device, in particular the switching device, and the device is present via the wiring harness. The electric device is a lambda sensor. A short circuit in the wiring harness in the connection to the lambda sensor can thus be detected by the control device. In addition, it is ensured that damage to the lambda sensor is avoided by this check for short circuits.

BRIEF DESCRIPTION OF THE DRAWINGS

Exemplary embodiments of the present invention are described in detail below with reference to the figures.

DETAILED DESCRIPTION OF EXAMPLE EMBODIMENTS

Figure 1:
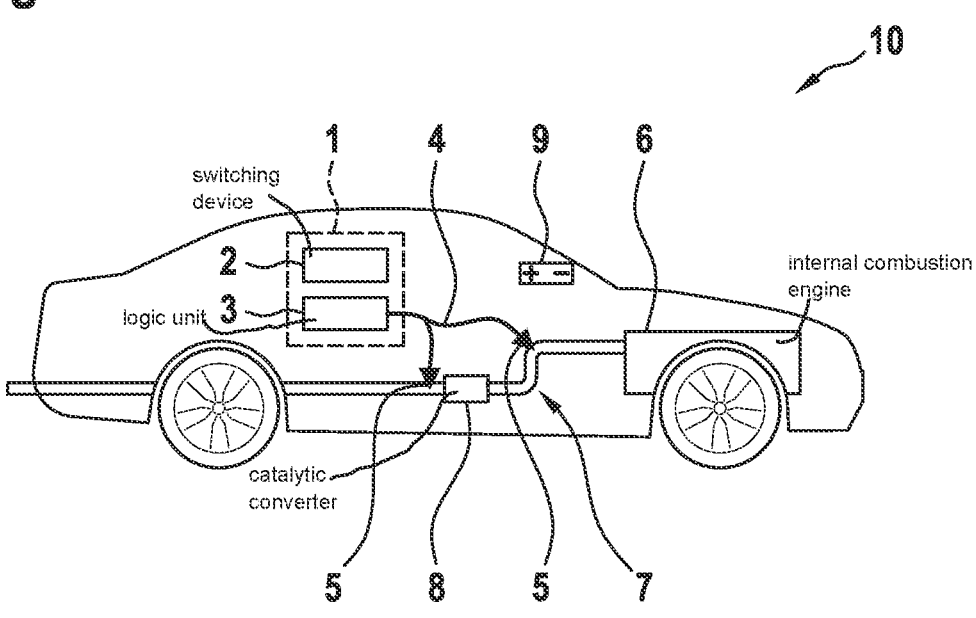
FIG. 1 shows a schematic view of a vehicle having a control device according to an exemplary embodiment of the present invention.

FIG. 1 schematically shows a vehicle 10 having a control device 1 according to an exemplary embodiment of the present invention. The vehicle 10 has an internal combustion engine 6 which ejects exhaust gases via an exhaust system 7. A catalytic converter 8 is attached in the exhaust system 7. In order to operate the catalytic converter 8 efficiently and/or to test the functionality of the catalytic converter 8, at least one electric device 5, preferably two electric devices 5, are provided, wherein the electric device 5 is a lambda sensor.

The control device 1 has a switching device 2 which is connected to a wiring harness 4 of the vehicle 10 in order to be connected to the electric device 5 via the wiring harness 4. The wiring harness 4 also connects an electric power supply 9, for example a battery, to the switching device 2 and/or to the electric device 5. The control device 1 also has a logic unit 3 for controlling the switching device 2.

The control device 1 is designed to detect a short circuit in the wiring harness 4 in the wiring of the electric device 5. In particular, the control device 1 enables the monitoring of individual lines of the wiring harness 4 which are used to connect the device 5. This allows a precise statement to be made about defective wires in the wiring harness 4 in the connection of the electric device 5.

For short circuit detection, the control device 1 is set up to carry out a measurement in which a measurement current is applied to the electric device 5 connected to the line to be monitored of the wiring harness 4, and a resulting electric measurement voltage is detected. A short circuit in the line can be detected by comparing an expected measurement voltage and an actual measurement voltage.

Figure 2:
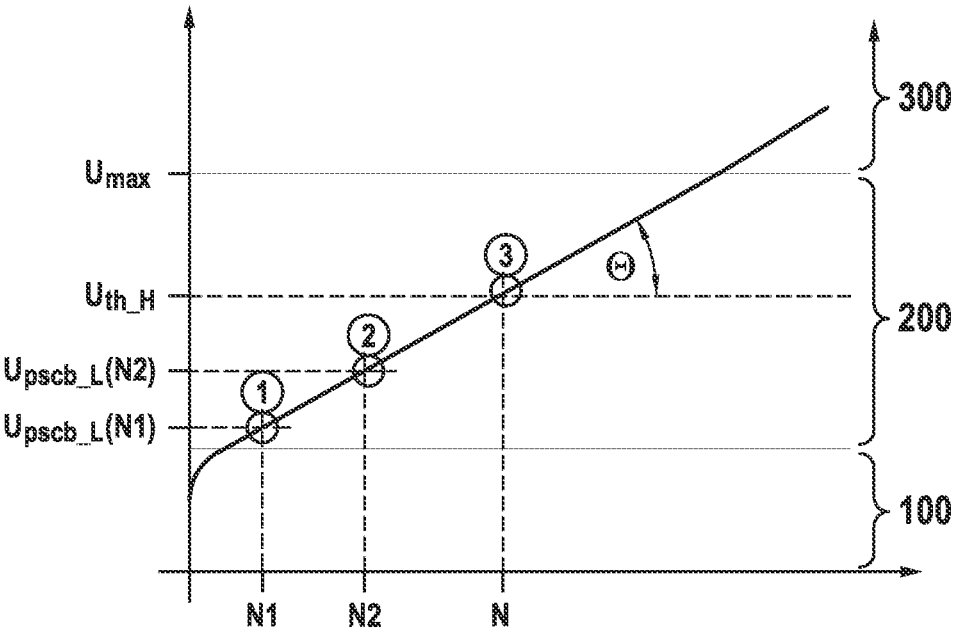
FIG. 2 shows a schematic view of a behavior of an electric device of the control device according to the exemplary embodiment of the present invention.

FIG. 2 shows a behavior of the entire system consisting of the control device 1 and electric device 5, wherein a current is plotted on the abscissa and a voltage is plotted on the ordinate. The current is represented in particular by an input variable N, N1, N2 of a current generation circuit. In particular, the following transfer functions result:

Generating the current I by means of a current mirror: $I(N)=G_1*I_Q*N+I_{off}$, where $G_1$ is a gain of the current mirror, $I_Q$ is a reference current and $I_{off}$ is an offset current of the current mirror.

Ascertaining the voltage $U_{pscb\_L}(N)$ from the current I using a level shifter: $U_{pscb\_L}(N)=U_{pscb\_off}+G_L*(R*I(N))$, where $U_{pscb\_off}$ is an offset voltage of the level shifter, $G_L$ is a gain of the level shifter and R is an electrical resistance of the electric device 5.

The respective gains $G_1$, $G_L$ and the resistance R have a tolerance. The electric device 5 therefore has to be prevented from being overloaded while the short circuit detection is being carried out. This is explained with reference to FIG. 2.

In a first voltage range 100, the ascertaining of the voltage $U_{pscb\_L}(N)$ does not behave in linear fashion, for which reason this voltage range is not to be used for measurements. Linear behavior is present in a subsequent second voltage range 200, so short circuit detection can be carried out optimally in the second voltage range 200. In a subsequent third voltage range 300, in contrast, a specification of the electric device 5 is exceeded, i.e. electric currents and/or voltages that are too high for the device 5 are present, which leads to damage and/or failure of the electric device 5.

It is therefore provided to ascertain the behavior of the voltage $U_{pscb\_L}(N)$ by means of two test measurements. For this purpose, the switching device 2 is designed to receive a specification for an output current, and to apply the output current to the electric device 5 connected to a line to be monitored of the wiring harness 4.

The logic unit 3 is designed to control the switching device 2 and carries out a first test measurement, a second test measurement, and the actual measurement for short circuit detection by means of the switching device 2. In the first test measurement, by means of the switching device 2 a first predefined electric current I(N1) is applied to the electric device 5 and a resulting first electric voltage $U_{pscb\_L}$(N1) is detected. In the second test measurement, by means of the switching device 2 a second predefined electric current I(N2) is applied to the electric device 5, and a resulting second electric voltage $U_{pscb\_L}$(N2) is detected, wherein the second electric current I(N2) is greater than the first electric current I(N1).

Based on the first test measurement and the second test measurement, a slope θ of the voltage-current line can be ascertained, which corresponds to a total gain G of the system.

$$G = \frac{U_{pscb\_L}(N2) - U_{pscb\_L}(N1)}{N2 - N1}$$

This relationship can be used to ascertain a measurement current I(N), which leads to a predefined target electric voltage $U_{th\_H}$. The predefined target electric voltage is selected in particular in the middle of the second voltage range 200. In this way, the risk of overloading the electric device 5 is reduced.

The logic unit 3 is thus designed to ascertain the measurement current I(N) on the basis of the predefined target electric voltage $U_{th\_H}$ by linear interpolation from the first electric current I(N1) and the second electric current I(N2) and the first electric voltage $U_{pscb\_L}$(N1) and the second electric voltage $U_{pscb\_L}$(N2):

$$N = \frac{U_{th\_H} - U_{pscb\_L}(N1)}{G} + N1$$

In the measurement carried out by the logic unit 3, by means of the switching device 2 the measurement current I(N) is applied to the electric device and a resulting electric measurement voltage is detected. If there is no short circuit, the expectation is that the target voltage $U_{th\_H}$ will be detected as the measurement voltage. If, on the other hand, a voltage differing therefrom has been detected as the measurement voltage, a short circuit is detected.

For the first test measurement, the second test measurement and the measurement, it is provided in each case that the switching device 2 and/or the logic unit 3 are designed to detect an electric voltage resulting from the application of the corresponding output current.

This enables the control device 1 to carry out a reliable measurement for short circuit detection without individual knowledge of the tolerances, wherein the risk of overloading the electric device 5 is prevented.

The measurement for short circuit detection is preferably carried out repeatedly. In particular, it is provided that the first test measurement and the second test measurement, as well as the ascertaining of the measurement current, are carried out once. The measurement current ascertained in this way can then be used for all measurements. Alternatively, the test measurements and the ascertaining of the measurement current can also be carried out repeatedly. In this case it is provided that these are carried out with a lower repetition rate than the measurement. This also allows parameter drifts that occur during operation of the electric device 5 and/or the control device 1 to be caught.

The invention claimed is:
1. A method for detecting a short circuit in a wiring harness which contacts at least one electric device, comprising the following steps:

carrying out a first test measurement in which a first predefined electric current is applied to an electric device connected to a line to be monitored of the wiring harness, and a resulting first electric voltage is detected;

carrying out a second test measurement in which a second predefined electric current is applied to the electric device connected to the line to be monitored of the wiring harness, and a resulting second electric voltage is detected, wherein the second electric current is greater than the first electric current;

ascertaining a measurement current based on a predefined target electric voltage by interpolation from the first electric current and the second electric current and the first electric voltage and the second electric voltage; and carrying out a measurement in which the measurement current is applied to the electric device connected to the line to be monitored of the wiring harness, and a resulting electric measurement voltage is detected;

wherein a short circuit is detected based on a comparison of the measurement voltage and the target voltage.

2. The method according to claim 1, wherein:

the step of carrying out the measurement is carried out repeatedly, and/or the steps of carrying out the first test measurement and the second test measurement and of ascertaining the measurement current are carried out once or repeatedly with a lower repetition rate than the carrying out of the measurement.

3. The method according to claim 1, wherein the ascertaining of the measurement current is carried out based on linear interpolation.

4. A non-transitory machine-readable storage medium on which is stored a computer program for detecting a short circuit in a wiring harness which contacts at least one electric device, the computer program, when executed by a computer, causing the computer to perform the following steps:

carrying out a first test measurement in which a first predefined electric current is applied to an electric device connected to a line to be monitored of the wiring harness, and a resulting first electric voltage is detected;

carrying out a second test measurement in which a second predefined electric current is applied to the electric device connected to the line to be monitored of the wiring harness, and a resulting second electric voltage is detected, wherein the second electric current is greater than the first electric current;

ascertaining a measurement current based on a predefined target electric voltage by interpolation from the first electric current and the second electric current and the first electric voltage and the second electric voltage; and carrying out a measurement in which the measurement current is applied to the electric device connected to the line to be monitored of the wiring harness, and a resulting electric measurement voltage is detected;

wherein a short circuit is detected based on a comparison of the measurement voltage and the target voltage.

5. A control device of a vehicle, the control device comprising:

a switching device which can be connected to a wiring harness in order to be connected to an electric device via the wiring harness; and a logic unit configured to control the switching device;

wherein the switching device is configured to:

receive a specification for an output current, and apply the output current to the electric device connected to a line to be monitored of the wiring harness;

wherein the logic unit is configured to:

carry out a first test measurement in which, using the switching device, a first predefined electric current is applied to the electric device, and a resulting first electric voltage is detected, carry out a second test measurement in which, using the switching device, a second predefined electric current is applied to the electric device, and a resulting second electric voltage is detected, wherein the second electric current is greater than the first electric current, ascertain a measurement current based on a predefined target electric voltage by interpolation from the first electric current and the second electric current and the first electric voltage and the second electric voltage, carry out a measurement in which, using the switching device, the measurement current is applied to the electric device and a resulting electric measurement voltage is detected, and carry out a detection of a short circuit based on a comparison of the measurement voltage and the target voltage; and wherein the switching device and/or the logic unit is configured to detect an electric voltage resulting from the application of the output current.

6. The control device according to claim 5, wherein the switching device is an application-specific integrated circuit.

7. The control device according to claim 5, wherein the logic unit is configured to:

to carry out the measurement repeatedly, and/or carry out the first test measurement and second test measurement and the ascertaining of the measurement current once or repeatedly with a lower repetition rate than the carrying out of the measurement.

8. The control device according to claim 5, wherein the logic unit is configured to carry out the ascertaining of the measurement current based on linear interpolation.

9. A vehicle, comprising:

a control device including a switching device and a logic unit;

a wiring harness connected to the switching device of the control device; and an electric device connected to the wiring harness, wherein the electric device is a lambda sensor;

wherein the control device a logic unit configured to control the switching device;

wherein the switching device is configured to:

receive a specification for an output current, and apply the output current to the electric device connected to a line to be monitored of the wiring harness; and wherein the logic unit is configured to:

carry out a first test measurement in which, using the switching device, a first predefined electric current is applied to the electric device, and a resulting first electric voltage is detected, carry out a second test measurement in which, using the switching device, a second predefined electric current is applied to the electric device, and a resulting second electric voltage is detected, wherein the second electric current is greater than the first electric current, ascertain a measurement current based on a predefined target electric voltage by interpolation from the first electric current and the second electric current and the first electric voltage and the second electric voltage, carry out a measurement in which, using the switching device, the measurement current is applied to the electric device and a resulting electric measurement voltage is detected, and carry out a detection of a short circuit based on a comparison of the measurement voltage and the target voltage; and wherein the switching device and/or the logic unit is configured to detect an electric voltage resulting from the application of the output current.

* * * * *